United States Patent [19]
Yamamichi

[11] Patent Number: 5,847,423
[45] Date of Patent: Dec. 8, 1998

[54] SEMICONDUCTOR DEVICE HAVING A THIN FILM CAPACITOR AND A RESISTANCE MEASURING ELEMENT

[75] Inventor: Shintaro Yamamichi, Tokyo, Japan

[73] Assignee: NEC Corporation, Tokyo, Japan

[21] Appl. No.: 883,334

[22] Filed: Jun. 26, 1997

[30] Foreign Application Priority Data

Jun. 26, 1996 [JP] Japan ................................ 8-166050

[51] Int. Cl.$^6$ ................................................ H01L 29/68
[52] U.S. Cl. ................... 257/296; 257/301; 257/302; 257/303; 257/304; 257/306; 257/310; 324/523; 324/524; 324/756
[58] Field of Search ................................. 257/296–298, 257/300–304, 306–312, 414, 525; 324/523, 524, 756

[56] References Cited

U.S. PATENT DOCUMENTS

| 5,398,205 | 3/1995 | Yamaguchi | 257/309 |
| 5,541,428 | 7/1996 | Nagatomo | 257/309 |

FOREIGN PATENT DOCUMENTS 4-324951  11/1992  Japan .

OTHER PUBLICATIONS

By S. Onishi et al., "A Half–Micron Ferroelectric Memory Cell Technology with Stacked Capacitor Structure", 1994 *IEEE*, pp. 843–846.

By P–Y. Lesaicherre et al., "A Gbit–scale DRAM stacked capacitor technology with ECR MOCVD SrTiO$_3$ and RIE patterned RuO$_2$/TiN storage nodes", 1994 *IEEE*, pp. 831–834.

*Primary Examiner*—Tom Thomas
*Assistant Examiner*—Fetsum Abraham
*Attorney, Agent, or Firm*—Young & Thompson

[57] ABSTRACT

A semiconductor device having thin film capacitors and containing resistance measuring elementsis disclosed. The thin film capacitor comprises a bottom electrode, a high permittivity dielectric, and a top electrode stacked on an interlayer insulation film and at least one of a plurality of contact formed in electrical contact with the substrate at the desired position of an interlayer insulation film formed on a semiconductor substrate. The bottom electrode comprises at least two layers. A resistance measuring element consists of the same materials as those of the thin film capacitor and has the same size as that of the thin film capacitor except that the resistance measuring element comprises a first electrode, the dielectric film of high permittivity, and a second electrode stacked on the interlayer insulation film and at least one of a plurality of contacts other than the above-mentioned contact for the thin film capacitor, and the topmost layer of the first electrode and the second electrode are in contact with each other through the contact provided at a portion of the dielectric film. The resistance value of the bottom electrode of the thin film capacitor is measured using electrical path through the substrate.

19 Claims, 5 Drawing Sheets

SEMICONDUCTOR DEVICE HAVING A THIN FILM CAPACITOR AND A RESISTANCE MEASURING ELEMENT

BACKGROUND OF THE INVENTION

1. Field of the Invention

This invention relates to semiconductor devices having a thin film capacitor fabricated on a substrate and a resistance measuring element fabricated on the same substrate. The resistance measuring element is utilized to characterize the quality of a bottom electrode of the thin film capacitor. The semiconductor device may be an integrated circuit comprising semiconductor memory devices.

2. Description of the Related Art

The semiconductor integrated circuit thin film capacitors having the structure provided with a multilayer of silicon oxide film and silicone nitride film as the top and bottom polysilicon electrode has been popularly used as the representative conventional dynamic random access memories (DRAM). However, because of minimization of capacitor area due to the requirement for smaller memory cell areas, it is necessary to use a film with extremely thin silicon oxide equivalent film thickness, as thin as 1 nm or thinner, to attain the capacitance density required for 1 GB DRAM or DRAM having larger capacitance.

A method for realizing the required high capacitance density, in which representative film of high permittivity dielectric substance such as $SrTO_3$ having the permittivity of about 300 at a room temperature and $(Ba, Sr) TiO_3$ having a higher permittivity is used as the capacitor insulation film, and multilayer barrier metal film of a substance which suppresses the diffusion of silicon and does not form a low permittivity oxide layer in oxidizing atmosphere during deposition of high permittivity film such as Pt/Ta or $RuO_2$/TiN is used as the bottom electrode. Such technology is presented in, for example, 1994 International Electron Devices Meeting Technical Digest on pages 831 to 834.

In this case, precious metals such as Pt and $RuO_2$ used for the first layer of the bottom electrode does not lose the conductivity in an oxidizing atmosphere during high permittivity film forming and does not form low permittivity layer, therefore it is used as the material which is in contact with a high permittivity film, high melting point metal such as TiN used for the second layer has the silicide forming temperature of as high as 600° C. or higher and suppresses the diffusion of silicon at a high temperature of a substrate during high permittivity film forming, therefore it is used as the electrode material which is in contact with a contact plug formed of polysilicon.

There is no conductive material currently which is provided with both characteristics, the one characteristics is that the material suppresses the diffusion of oxygen and does not lose the conductivity in oxidizing atmosphere during high permittivity film forming and the other characteristics is that the material suppresses the diffusion of silicon in the high substrate temperature during high permittivity film forming. The reason is described herein under. Though the metal film of the first layer is excellent in oxidation resistance, the silicide forming temperature is low as Pt, or a film of a low permittivity substance such as silicon oxide is formed on the interface when a film is formed immediately on silicon as $RuO_2$, and the metal film of the second layer is poor in oxidation resistance. Therefore, a barrier metal film is inevitably formed of a multilayer film comprising two or more layers. If a low permittivity layer is formed on the surface of the bottom electrode or is formed on any of interfaces of the bottom electrode, or the resistance of the bottom electrode increases due to oxidation of the bottom electrode itself, then the capacitor cannot store the required charge and causes malfunctions such as bit open.

Generally, the electric characteristics such as the permittivity of a high permittivity film and leak current depends significantly on the crystallinity of high permittivity material, it has been known that the fabrication of a thin film at a temperature as high as possible in oxidizing atmosphere results in the higher crystallinity, and the more excellent electric characteristics. On the other hand, such a high temperature process in oxidizing atmosphere results in readily the increased resistance of the bottom electrode. Therefore, the improvement in conductivity of the bottom electrode and improvement in characteristics of high permittivity film are a conflicting thesis, and it is essentially required to form a high permittivity film at a temperature as high as possible with monitoring accurately the resistance of the bottom electrode in order to obtain good characteristics.

For example, S. Onishi et al evaluated the resistance of Pt/TiN bottom electrode using the contact chain pattern which is used generally for measuring contact resistance of multlayer interconnection barrier metal as described in 1994 International Electron Devices Meeting Technical Digest on pages 843 to 846. The conventional element for measuring contact resistance is shown in FIG. 6. However, in the case that this method is used, though TiN is oxidized from the surface during forming of a high permittivity PZT film and titanium oxide layer with large resistance is formed on the Pt/TiN interface, the apparent resistance is low because the measurement current flows passing through low resistance region and the TiN second bottom layer of the bottom electrode which retains the conductivity. However, in the case that the Pt/TiN is used actually for the bottom electrode, the resistance in the vertical direction of the whole bottom electrode increases due to titanium oxide layer on the Pt/TiN interface, and the capacitor cannot operates normally. The reason is attributed to the inevitable oxidation reaction involving active oxygen during fabrication of film of ferro-electric or high permittivity material as described hereinbefore, and is attributed to the process that TiN surface is oxidized through the grain boundary of Pt and interface of Pt/TiN sidewall.

K. Takemura et al evaluated indirectly the damage of the bottom electrode by way of a method in which a required capacitor was fabricated in the actual form and evaluated the dependence of the capacitance value and dielectric loss on frequency to evaluate qualitatively the resistance of the bottom electrode. However, in this evaluation method, it is required to measure in the frequency range of GHz order where usually semiconductor devices are operated actually, for such high frequency measurement usually a particular measurement circuit is required, therefore the accurate resistance cannot be measured for actually required element structure. Further, in this method, because the resistance value is calculated from the frequency at the frequency dispersion of the capacitance value, such a slight increase in resistance value as the frequency dispersion cannot be observed cannot evaluated to begin with, and the resistance value cannot be estimated qualitatively.

The contact resistance measuring element for multlayer interconnection shown in FIG. 1 of Japanese Patent Laid-Open (KOKAI) No. Hei 4-324951 can measure the contact resistance between wiring materials buried in each contact, but cannot evaluate the resistance value of the whole bottom electrode of the capacitor. The resistivity of the material used for multlayer interconnection remains small usually even after deposition and etching process, therefore the drawing of the pattern in the horizontal direction does not affect the measurement of the contact resistance of the internal of the contact, but as for the bottom electrode material because the resistance can increase easily due to oxidation during the process, only the evaluation on the capacitor in the actual form can give correct resistance value of the bottom electrode. In particular, the material of lower layer which is in contact with polysilicon in the bottom electrode is easily oxidized during deposition of a high permittivity film if it is drawn horizontally, the resistance value falls into the value which is different from the value of the material oxidized during fabrication of the thin film capacitor.

As described herein above, the conventional semiconductor device cannot measure accurately the resistance value of the bottom electrode of a capacitor, it is a problem. This problem is very serious problem from the view point that the upper limit of the substrate temperature for deriving the electric characteristics of high permittivity films and ferroelectric films to the maximum and the upper limit of the process temperature after capacitor forming cannot be prescribed. It is essentially necessary to evaluate the resistance value of the bottom electrode of a capacitor in order to improve the quality and yield of semiconductor devices.

SUMMARY OF THE INVENTION

It is therefore an object of the present invention to derive the performance of thin film capacitors such as high permittivity and ferroelectric characteristics to the maximum by measuring accurately the resistance value of the bottom electrode of a capacitor on the same substrate without additional complex process in the semiconductor device having a thin film capacitor using a high permittivity thin film or ferroelectric thin film.

A semiconductor device of the present invention has thin film capacitors and contains resistance measuring elements, in which each thin film capacitor comprises a bottom electrode, a high permittivity dielectric, and a top electrode stacked on an interlayer insulation film and at least one of a plurality of contacts in electric contact with the substrate formed at the desired position of an interlayer insulation film on a semiconductor substrate, and the bottom electrode comprises at least two layers, and in which each resistance measuring element comprises a first electrode, a dielectric film of high permittivity, and a second electrode stacked on the interlayer insulation film and at least one of a plurality of contacts other than the above-mentioned contact for the thin film capacitor, the first and second electrodes consist of the same materials as those of the bottom electrode and the top electrode respectively, and the top layer of the first electrode and the second electrodes are in contact with each other through an opening provided at a portion of the dielectric film of high permittivity.

A semiconductor device of the present invention has thin film capacitors and contains resistance measuring elements, in which each thin film capacitor comprises a bottom electrode, a high permittivity dielectric, and a top electrode stacked on an interlayer insulation film and at least one of a plurality of contacts in electric contact with the substrate formed at the desired position of an interlayer insulation film on a semiconductor substrate, and the bottom electrode comprises at least two layers, and in which each resistance measuring element comprises a first electrode, a dielectric film of high permittivity, and a second electrode stacked on the interlayer insulation film and at least one of a plurality of contacts other than the above-mentioned contact for the thin film capacitor, the first and second electrodes consisting of the same materials as those of the bottom electrode and the top electrode respectively, the first electrode has the same configuration as that of the bottom electrode, and the top layer of the first electrode and the second electrode are in contact with each other through an opening provided at a portion of the dielectric film of high permittivity.

A semiconductor device has thin film capacitors and contains resistance measuring elements, in which each thin film capacitor comprises a bottom electrode, a high permittivity dielectric, and a top electrode stacked on an interlayer insulation film and at least one of a plurality of contacts formed at the desired position of an interlayer insulation film on a semiconductor substrate, and the bottom electrode comprises at least two layers, and in which each resistance measuring element, consisting of the same materials as those of the thin film capacitor and have the same size as that of the thin film capacitor, comprises a first electrode, a dielectric film of high permittivity, and a second electrode stacked on the interlayer insulation film and at least one of a plurality of contacts other than the above-mentioned contact for the thin film capacitor, and the top layer of the first electrode and the second electrode are in contact with each other through an opening provided at a portion of the dielectric film of high permittivity.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE PREFERRED EMBODIMENTS

Figure 1:
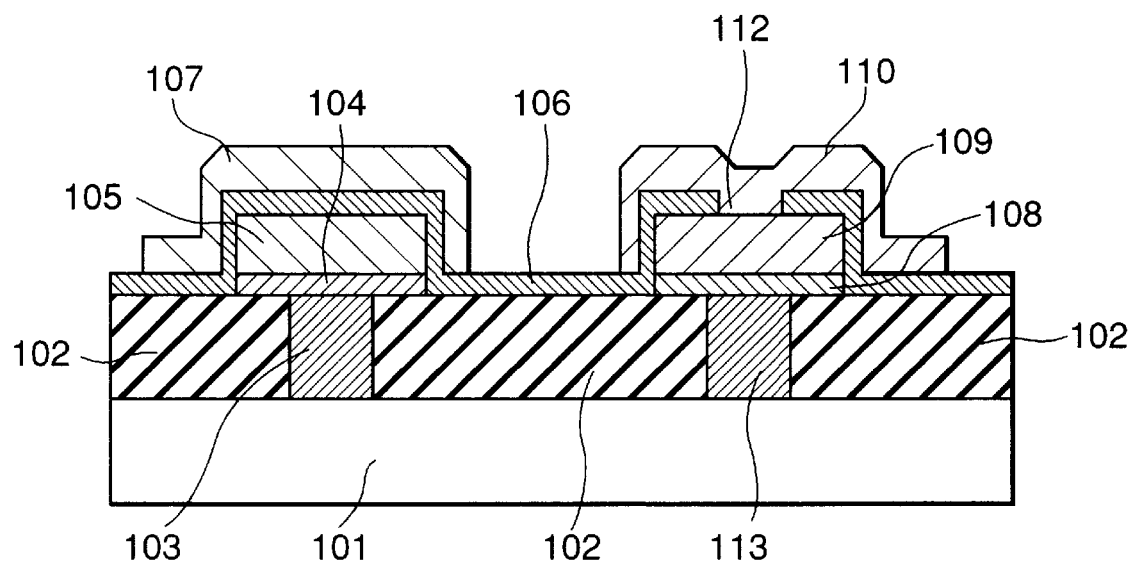
FIG. 1 is a cross-sectional view of a semiconductor device for illustrating the structure of the first embodiment of the present invention.

The embodiments of the present invention will be described in detail hereinafter referring to the drawings.

FIG. 1 is a cross-sectional view of a semiconductor device used for describing the structure of the first embodiment of the present invention. The semiconductor device contains a thin fill capacitor and a resistance measuring element, the thin film capacitor has the structure in which, on a contact 103 buried with phosphorus doped polysilicon formed at the desired position of an interlayer insulation silicon oxide film 102 (600 nm) and interlayer insulation film 102 on a n-type silicon substrate 101 with resistivity of $0.1\Omega$. cm, a bottom electrode film, a high permittivity film 106 ($Ba_{0.5}Sr_{0.5})TiO_3$ (100 nm) (abbreviated to as BEST hereinafter), and a top electrode film 107 of Al (1 μm)/TiN (100 nm) are stacked, and the bottom electrode film comprises two layers of a RuO₂ film 105 (500 nm) and TiN film 104, and the resistance measuring element has the structure in which, on an interlayer insulation film 102 and a contact 113, first electrodes 108 and 109, a high permittivity film BEST 106 (100 nm), and a top electrode film 107 of Al (1 μm)/TiN (100 nm) are stacked in the order, and the top layer 109 of the first electrode is in contact with the second electrode 110 through an opening provided partially on the high permittivity film 106. In other words, the resistance measuring element has the same structure as that of the thin film capacitor excepting that the first electrode and the second electrode are in contact each other through the opening 112 in the resistance measuring element.

Herein, the resistance measuring element is described. The first electrodes 109 and 108 consist of the same materials as those of the bottom electrode 105 and 104. In other words, the first electrodes 109 and 108 have a two layer structure comprising RuO2/TiN. The first electrodes 109 and 108 have the same size and configuration as those of the bottom electrodes 105 and 104 of the thin film capacitor. Because the first electrodes 109 and 108 of the resistance measuring element are covered with the high permittivity film 106, the first electrodes 109 and 108 are subjected to the quite same heat history and oxidizing atmosphere as the actual thin film capacitor, and thus the resistance value in the vertical direction of the bottom electrode of the thin film capacitor is correctly determined by measuring the resistance between the second electrode 110 and the silicon substrate 101. Further, the thin film capacitor which serves as a memory element and the resistance measuring element which serves to measure the resistance value of the bottom electrode of the thin film capacitor are fabricated easily on the same semiconductor substrate without using a particular complex process, therefore, by using this resistance measuring element as a check pattern, the reliability of the semiconductor device can be evaluated and the evaluation is helpful for improvement of the yield.

Actually, the resistance measuring element may be formed on an unused area such as scribing area between a chip and a chip on a semiconductor device such as a DRAM, such disposition is preferable because the chip area is not increased.

Figure 2:
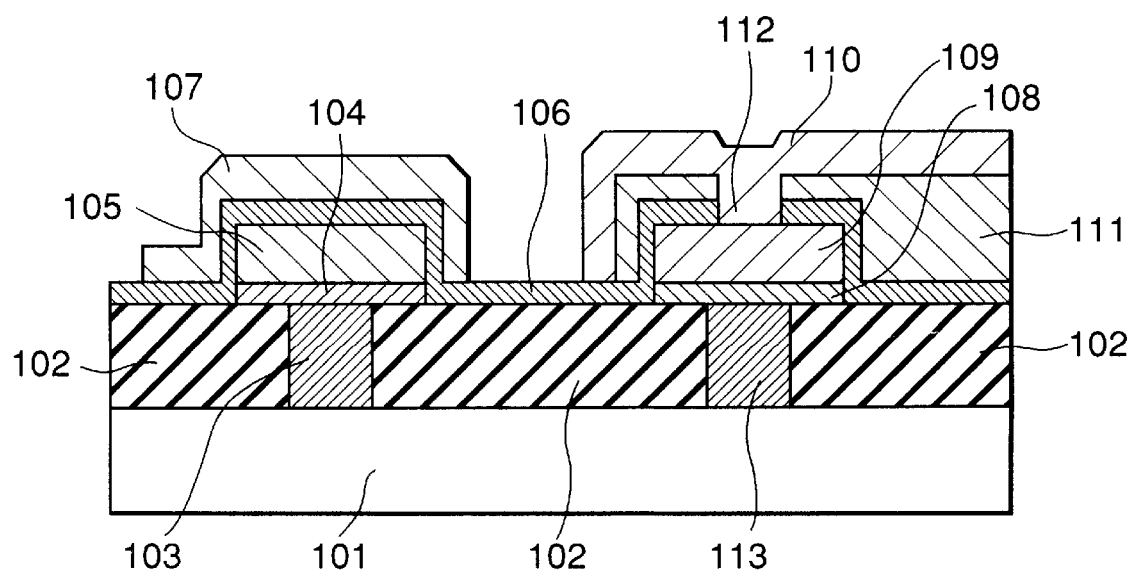
FIG. 2 is a cross-sectional view of a semiconductor device for illustrating the structure of the second embodiment of the present invention.

FIG. 2 is a cross-sectional view of a semiconductor device for describing the second embodiment of the present invention. A thin film capacitor is formed in which, on a contact 103 buried with phosphorus doped polysilicon formed at the desired position of an interlayer insulation silicon oxide film 102 (600 nm) and interlayer insulation film 102 on a n-type silicon substrate 101 with resistivity of 0.1Ω. cm, a bottom electrode film, a high permittivity film BST 106 (100 nm), and a top electrode film 107 of Al (1 μm)/TiN (100 nm) are stacked, and the bottom electrode film comprises two layers of a RuO₂ film 105 (500 nm) and TiN film 104. Further, a resistance measuring element is formed in which, on an interlayer insulation film 102 and a contact 113, first electrodes 108 and 109, a high permittivity film BST 106 (100 nm), and a top electrode film 107 of Al (1 μm)/TiN (100 nm) are stacked in the order, the first electrodes 109 and 108 and the second electrode 110 consist of the same materials as those of the bottom electrodes 105 and 104 of the thin film capacitor and top electrode 107 respectively, and the first electrodes 109 and 108 have the same size as that of the bottom electrodes 105 and 104 of the thin film capacitor, and the top layer 109 of the first electrode is in contact with the second electrode 110 through an opening provided partially on the high permittivity film 106.

Herein, the resistance measuring element is described. The top layer 109 of the first electrode is insulated from the high permittivity film 106 by the second interlayer insulation film 111 on the area other than the area where the top layer 109 of the first electrode is electrically connected to the second electrode 110 through the opening 112. A spin-on-glass (SOG) film, which provides easily insulation at a low temperature, is preferably used for the second interlayer insulation layer. By using the second interlayer insulation film 111, a step formed due to the bottom electrode of the thin film capacitor is reduced and flattened, and thereby exposing for providing the opening contact 112 between electrodes of the resistance measuring element and etching process becomes easy. Accordingly, the yield is improved, and the reliability as a check pattern is improved. Further, if the high permittivity film causes short circuit, the resistance measuring element operates normally due to the second interlayer insulation film such as SOG film, thus this method is advantageous in that the resistance can be measured regardless of the yield of the high permittivity film.

Figure 3:
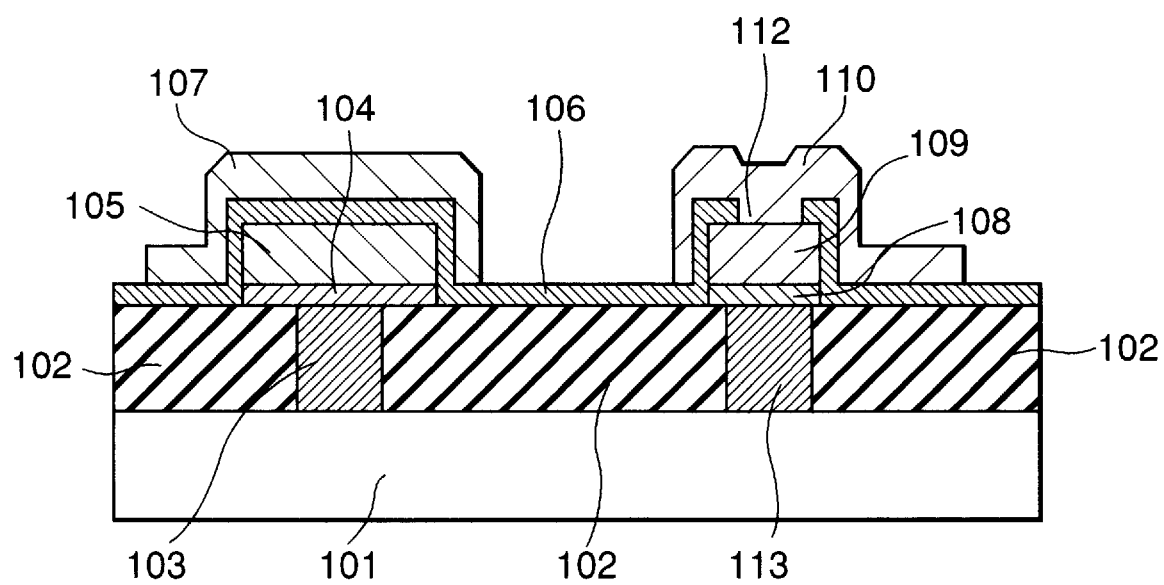
FIG. 3 is a cross-sectional view of a semiconductor device for illustrating the structure of the third embodiment of the present invention.

FIG. 3 is a cross-sectional view of a semiconductor device for describing the structure of the third embodiment of the present invention. A thin film capacitor is formed in which, on a contact 103 buried with phosphorus doped polysilicon formed at the desired position of an interlayer insulation silicon oxide film 102 (600 nm) and interlayer insulation film 102 on a n-type silicon substrate 101 with resistivity of 0.1 Ω.cm, a bottom electrode film, a high permittivity film BST 106 (100 nm), and a top electrode film 107 of Al (1 μm)/TiN (100 nm) are stacked, and the bottom electrode film comprises two layers of a RuO₂ film 105 (500 nm) and TiN film 104. Further, a resistance measuring element is formed in which, on an interlayer insulation film 102 and a contact 113, first electrodes 108 and 109, a high permittivity film BST 106 (100 nm), and a top electrode film 107 of Al (1 μm)/TiN (100 nm) are stacked in the order, the first electrodes 109 and 108 and second electrode 110 consist of the same materials as those of the bottom electrodes 105 and 104 and top electrode 107 of the thin film capacitor, and the top layer 109 of the first electrode is in contact with the second electrode 110 through an opening provided partially on the high permittivity film 106.

Herein, though the top layer 109 of the first electrode of the resistance measuring element is connected to the second electrode 110 by way of the opening 112, the size in the horizontal direction of the first electrode itself is smaller than the bottom electrode of the thin film capacitor. Generally in the fabrication of semiconductor devices, the size of the bottom electrode of the thin film capacitor is different depending on locations due to the irregularity of exposing and etching processes, the process temperature margin is different depending on the horizontal size. In particular, in deposition of high permittivity film such as BEST, because mainly the oxidation from the interface of RuO₂/TiN of the bottom electrode causes the resistance increase, the bottom electrode having a smaller size is more sensitive to the oxidation. Accordingly, in the fabrication of a resistance measuring element as a check pattern on a semiconductor device, the upper limit of the process temperature is evaluated more accurately by fabricating electrodes having a plurality of sizes different from that of the electrode of the bottom electrode of a thin film capacitor. In order to determine the upper limit of the temperature margin, it is preferable to fabricate a resistance measuring element having the first electrode with a smaller size than that of the bottom electrode of the actual thin film capacitor.

Figure 4A:
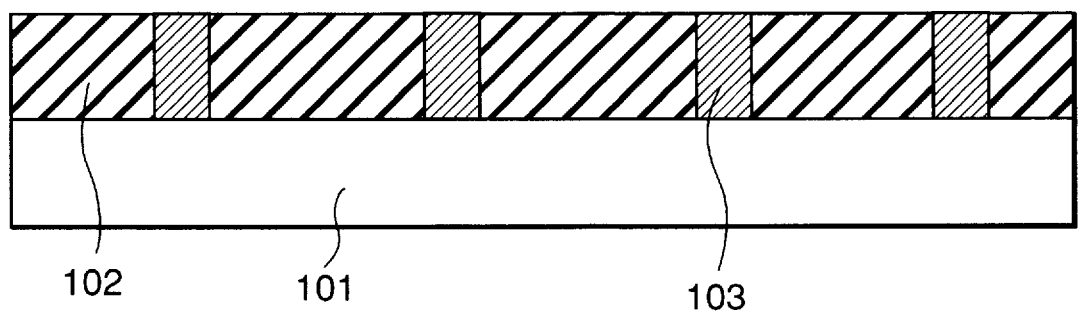
FIG. 4 is a set of cross-sectional views for describing steps of the fabrication process of a semiconductor device for illustrating one example of the present invention.
Figure 4B:
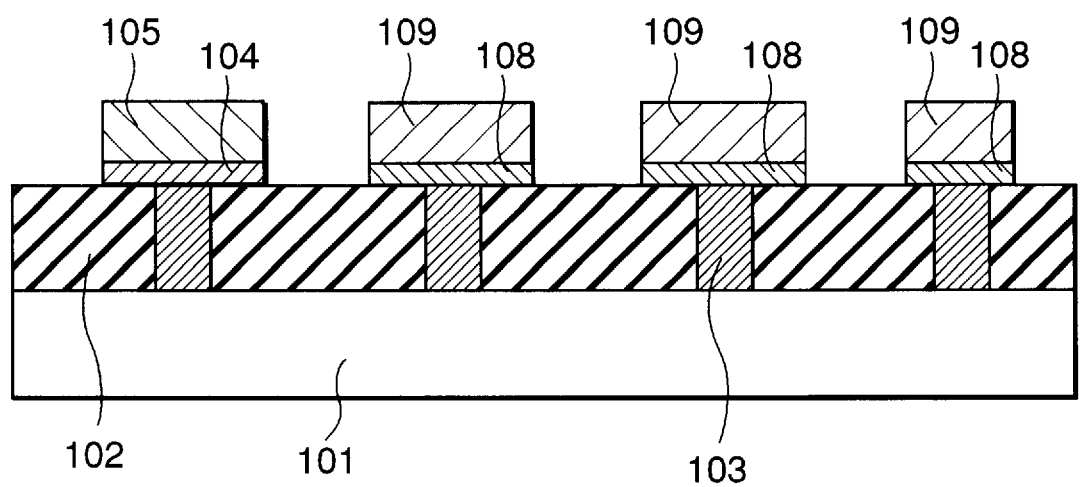
Figure 4C:
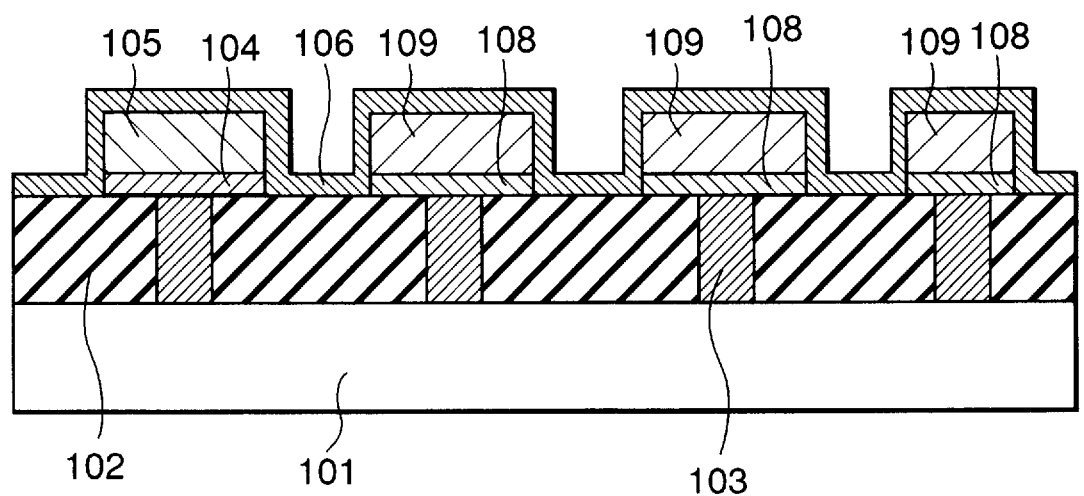
Figure 5A:
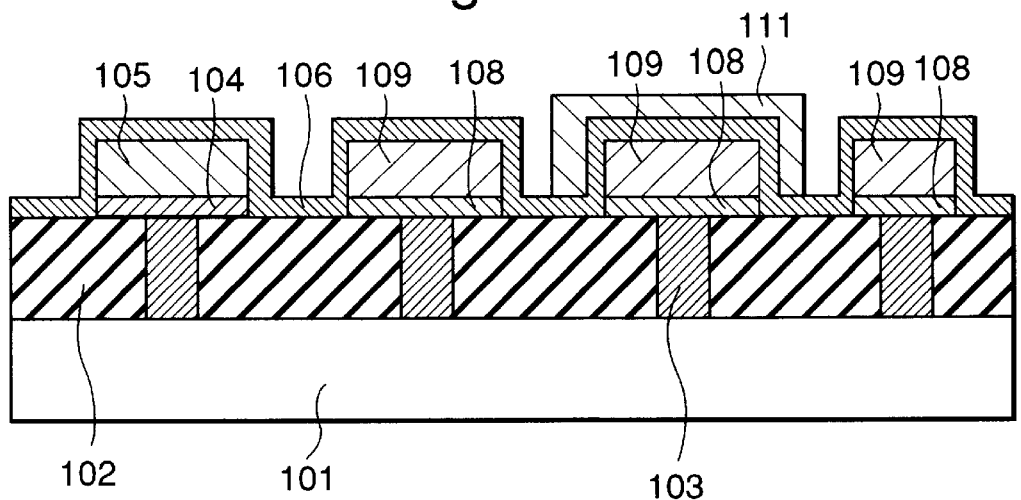
FIG. 5 is a set of cross-sectional view for describing steps of the fabrication process of a semiconductor device for illustrating one example of the present invention.
Figure 5B:
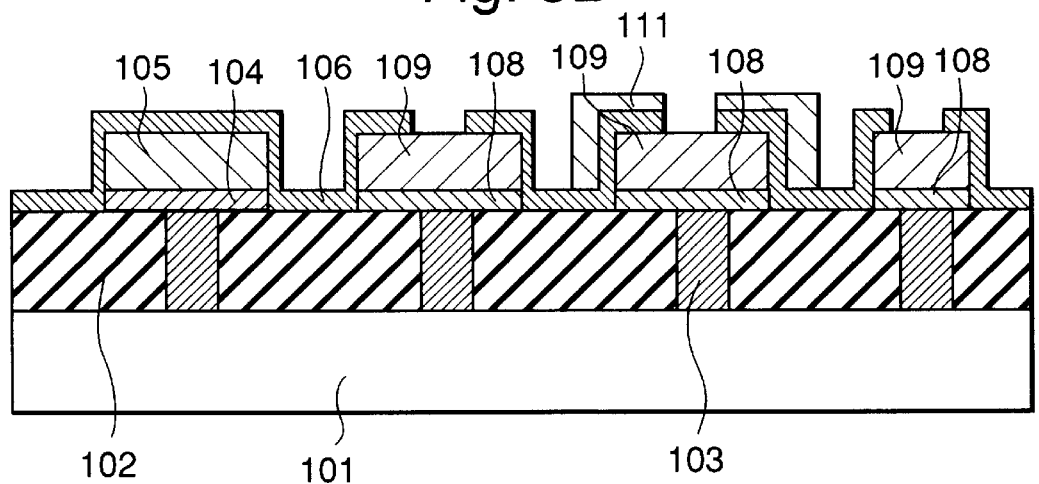
Figure 5C:
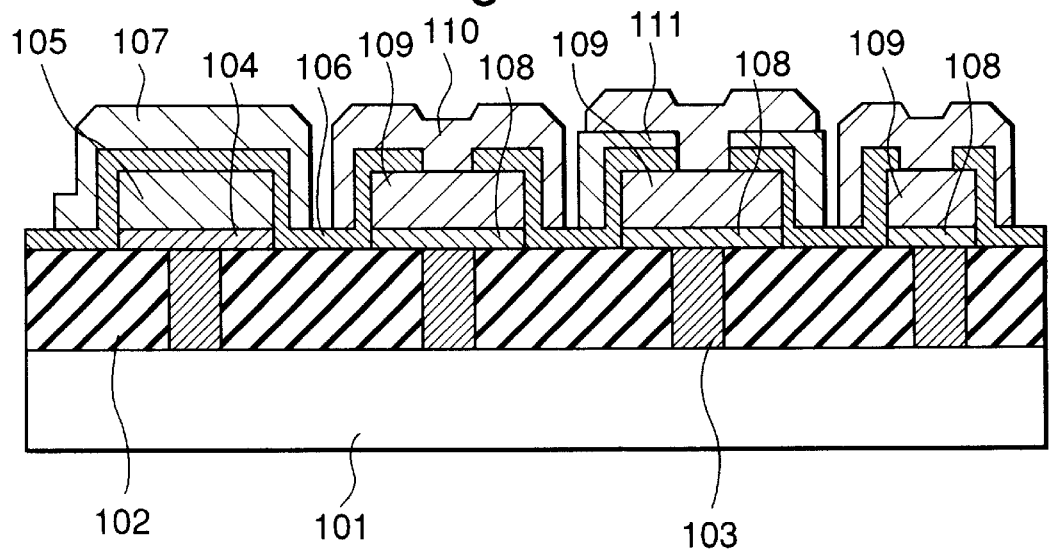
Figure 6:
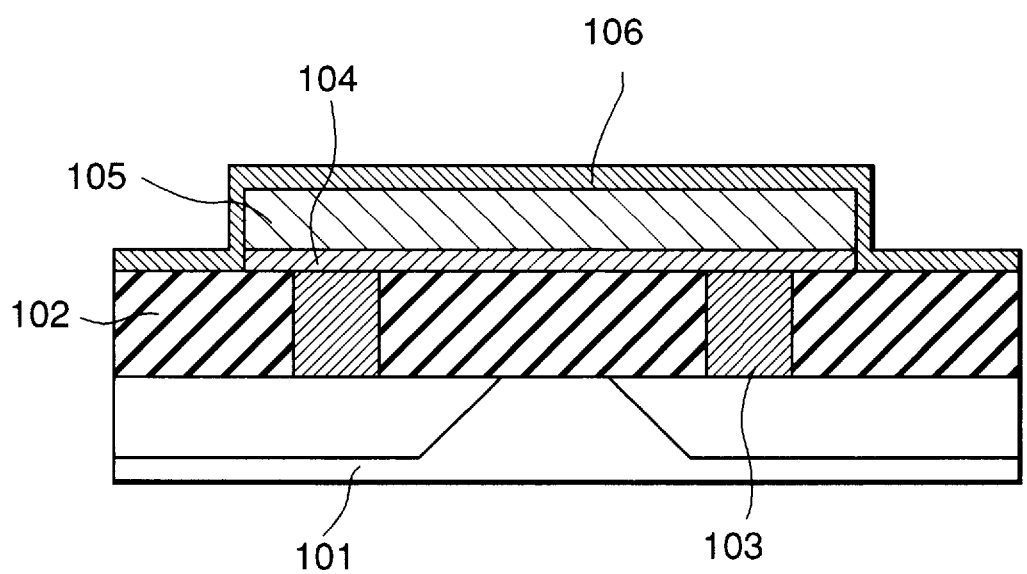
FIG. 6 is a cross-sectional view for illustrating the structure of a conventional resistance measuring element.

FIG. 4 and FIG. 5 are cross-sectional views for describing steps of the fabrication process of a semiconductor device for describing one embodiment of the present invention. As shown in FIG. 4(a), a silicon oxide interlayer insulation film 102 having a thickness of 600 nm is formed by oxidation on a n-type silicon substrate 101 of 0.1 Ω.cm, subsequently a contact hole is provided at the desired position, and a polysilicon layer 103 having a thickness of 1 $\mu$m is deposited by CVD and phosphorus is diffused to render it with low resistivity. Subsequently, by way of reactive etching using chlorine gas, the polysilicon on the interlayer insulation film is etched back to remove it. Next as shown in FIG. 4(b), TiN 104 and $RuO_2$ 105 are deposited in the order by way of reactive sputtering using a metal target, then a SOG film is coated as a hard mask and baked at 200° C. for 1 hr, the resist is patterned, and $RuO_2$/TiN is worked to form a desired size by way of electron cyclotron resonance (ECR) plasma etching using a mixture of chlorine gas and oxygen gas. In this case, the size of the portion to be a first electrode may be equal to the size of the bottom electrode to be a thin film capacitor or may be smaller than that of the bottom electrode. Next as shown in FIG. 4(c), a high permittivity film BEST 106 (100 nm) is deposited by way of EAR-MOCVD using a mixture of $Ba(DPM)_2$, $Sr(DPM)_2$, $Ti(i-OC_3H_7)$, and oxygen gas as feeding gas under the condition of a substrate temperature of 450° C. and a gas pressure of 7 mTorr. Further as required as shown in FIG. 5(a), a SOG film is coated and baked at 200° C. for 1 hr, the resist is patterned so that the SOG film is removed to expose unnecessary portions for the thin film capacitor and resistance measuring element, thereafter dry etching may be carried out using $CHF_3$ gas. Next as shown in FIG. 5(b), the resist is patterned so that the desired portion of the BEST film is exposed for contact between the first electrode and the second electrode in the resistance measuring element, and the BEST film is etched by way of EAR plasma etching using chlorine gas. Finally as shown in FIG. 5(c), a top electrode film 107 of Al (1 $\mu$m) /TiN (50 nm) is deposited by way of DC spattering using a metal target, and worked to form a desired size by way of reactive ion etching (RIE) using chlorine gas.

According to the fabrication sequence described herein above, the required thin film capacitor and the resistance measuring element are simultaneously fabricated on the same substrate, in the case that the size of the bottom electrode and first electrode are 1 $\mu$m square, the capacitor capacitance is 25 fF/$\mu m^2$ and contact resistance value is 1 kΩ respectively, it is confirmed that the resistance value of the thin film capacitor and the bottom electrode thereof are simultaneously measured. Because the resistance value of 100 kΩ or less is obtained with the first electrode having a size as small as 0.5 $\mu$m square of the resistance measuring element, it is also confirmed that the fabrication process of high permittivity BEST up to 450° C. is not involved in the problem up to this size of the bottom electrode.

In the description of the above-mentioned first embodiment to third embodiment and examples, TiN is exemplified as the lower layer 104 of the bottom electrode, however, any substance may be used as long as the substance has the silicification temperature, namely the temperature at which the substance causes silicification reaction with silicon, higher than the film forming temperature of the high permittivity film. At lease one of metals, or nitride films of the metal, or films which contain nitrogen in these films, or silicide films of Ti, W, Ta, Mo, Co, and Ni, among the above-mentioned substances, are preferably used because the fabrication of capacitors and resistance measuring elements of the present invention can be carried out using current LSI process and is excellent in productivity.

In the description of the above-mentioned first embodiment to third embodiment and examples, $RuO_2$ is exemplified as the top layer of the bottom electrode, however, any substance may be used as long as the substance does not lose the conductance even in the oxidizing atmosphere during deposition of the high permittivity film, does not form a low permittivity layer, and prevents the diffusion of oxygen. For example, at least any one materials selected from the group consisting of metals of Ru, Re, Os, Ir, and Rh, oxide thereof, or silicide compound thereof, or at least any one materials selected from the group consisting of Pt, Pd, and Rh, may be used effectively as described, for example, in the invention invented by Matsubara applied by the same applicant as that of this invention. Among these materials, $RuO_2$ and RuO are advantageous in that ultra-fine working is possible using a mixture of chlorine gas and oxygen gas.

In the description of the above-mentioned first embodiment to third embodiment and examples, $(Ba_{0.5}Sr_{0.5})TiO_3$ is exemplified as the high permittivity film, however, a substance of the high permittivity film having the chemical formula of $ABO_3$ wherein A is at least one substance selected from a group consisting of Ba, Sr, Pb, Ca, La, Li, and K, B is at least one substance selected from a group consisting of Zr, Ti, Ta, Nb, Mg, Mn, Fe, Zn, and W, for example, $SrTiO_3$, $PbTiO_3$, $Pb(Zr, Ti)O_3$, (Pb, La) (Zr, Ti)$O_3$, $Pb(Mg, Nb)O_3$, $Pb(Mg, W)O_3$, $Pb(Zn, Nb)O_3$, $LiTaO_3$, $LiNbO_3$, $KTaO_3$, and $KNbO_3$ are included in the examples, or substances represented by the chemical formula $(Bi_2O_2)(A_{m-1}B_mO_{3m+1})$ (m=1, 2, 3, 4, and 5) wherein A is at least one substance selected from a group consisting of Ba, Sr, Pb, Ca, K, and Bi, and B is at least one substance selected from a group consisting of Nb, Ta, Ti, and W, for example, $Bi_4Ti_3O_{12}$, $SrBi_2Ta_2O_9$, and $SrBi_2Nb_2O_9$, or other substances than the above-mentioned substances which have the chemical formula described above such as $Ta_2O_5$ may be used effectively.

As described hereinbefore, the first effect of the semiconductor device of the present invention is to provide a method for measuring the resistance value of the bottom electrode after fabrication of the thin film capacitor using high permittivity film on the same substrate.

The measurement is possible because the resistance measuring element having the first electrode which consists of the same material and has the same size as those of the bottom electrode of the thin film capacitor is provided on the same substrate, wherein the first electrode is in contact with the second electrode through the contact provided at a portion of the high permittivity film.

The second effect is to provide the capability of measurement of resistance value of the bottom electrode regardless of the characteristics of the insulation film of the thin film capacitor to results in the improved reliability of the semiconductor device.

The reliability is improved because the insulation of required portions of the first electrode and second electrode is ensured using the second interlayer insulation film after deposition of the high permittivity film of the resistance measuring element, and the resistance measuring element is fabricated stably independently from the characteristics of the thin film capacitor.

The third effect is to provide a method for determining the upper limit of the process temperature accurately for favoring to derive the performance of the thin film capacitor to result in the improved performance of the semiconductor device.

The performance of the semiconductor device is improved because the increase in the resistance value can be observed under more severe condition than for the actual memory element with aid of using the resistance measuring element having the first electrode having a size smaller than that of the bottom electrode of the thin film capacitor.

What is claimed is:

1. A semiconductor device having a thin film capacitor and a resistance measuring element formed on a substrate, said semiconductor device comprising:

an interlayer insulation film formed on said substrate, said interlayer insulation film having a plurality of contact holes formed therein to reach said substrate;

a thin film capacitor comprising a bottom electrode, a dielectric film, and a top electrode laminated on one of said contact holes, said bottom electrode comprising at least two layers;

a resistance measuring element comprising a first electrode, said dielectric film, and a second electrode laminated on another of said plurality of contact holes, said first and second electrodes formed of the same layers as those forming said bottom electrode and said top electrode respectively, and a topmost layer of said first electrode and said second electrode being in contact with each other through an opening in said dielectric film.

2. The semiconductor device as claimed in claim 1, wherein a width of said first electrode in a direction parallel to said substrate is smaller than that of said bottom electrode.

3. The semiconductor device as claimed in claim 1 further comprising a plurality of said resistance measuring elements having first electrodes differently sized from said bottom electrode.

4. The semiconductor device as claimed in claim 1, wherein said resistance measuring element is formed on a scribing area.

5. A semiconductor device having a thin film capacitor and a resistance measuring element formed on a substrate, said semiconductor device comprising:

an interlayer insulation film formed on said substrate, said interlayer insulation film having a plurality of contact holes formed therein to reach said substrate;

a thin film capacitor comprising a bottom electrode, a dielectric film, and a top electrode laminated on one of said contact holes, said bottom electrode comprising at least two layer;

a resistance measuring element comprising a first electrode, said dielectric film, and a second electrode laminated on another of said plurality of contact holes, said first and second electrodes formed of the same layers as those forming said bottom electrode and said top electrode respectively, said first electrode having a same width and thickness as that of said bottom electrode, and a topmost layer of said first electrode and said second electrode being in contact with each other through an opening in said dielectric film.

6. The semiconductor device as claimed in claim 5, wherein said resistance measuring element is formed on a scribing area.

7. A semiconductor device having a thin film capacitor and a resistance measuring element formed on a substrate, said semiconductor device comprising:

an interlayer insulation film formed on said substrate, said interlayer insulation film having a plurality of contact holes formed therein to reach said substrate;

a thin film capacitor comprising a bottom electrode, a dielectric film, and a top electrode laminated on one of said contact holes, said bottom electrode comprising at least two layers;

a resistance measuring element comprising a first electrode, said dielectric film, and a second electrode laminated on another of said plurality of contact holes, said first and second electrodes formed of the same layers and having a same width as those forming said bottom electrode and said top electrode respectively, and a topmost layer of said first electrode and said second electrode being in contact with each other through an opening in said dielectric film.

8. The semiconductor device as claimed in claim 7, wherein said resistance measuring element is formed on a scribing area.

9. A semiconductor device comprising:

a substrate having a first portion and a second portion;

an insulating film formed on said substrate, said insulating film having a first contact hole and a second contact hole;

a first conductive film formed on said insulating film to electrically connect with said first portion through said first contact hole;

a second conductive film formed on said insulating film to electrically connect with said second portion through said second contact hole, said second conductive film formed from a same material as said first conductive film;

a third conductive film formed on said first conductive film;

a fourth conductive film formed on said second conductive film, said fourth conductive film being formed from a same material to said third conductive film, said third and fourth conductive films being formed from a different material from said first and second conductive films;

a first dielectric film covering said first and third conductive films;

a second dielectric film covering said second and fourth conductive films, said second dielectric having an opening;

a fifth conductive film covering said first dielectric film, said first and third conductive films constituting a bottom electrode of a capacitor and said fifth conductive film constituting a top electrode of said capacitor; and a sixth conductive film covering said second dielectric film, said sixth conductive film contacting said fourth conductive film through said opening.

10. The device as claimed in claim 9, wherein said first and second dielectric films are a high permittivity film.

11. The device as claimed in claim 10, wherein said first and second conductive films have silicification temperature higher than the film forming temperature of said high permittivity film.

12. The device as claimed in claim 11, wherein said first and second conductive films are formed by material selected from at least one of metals, nitride films of metal, films containing nitrogen, and silicide films.

13. The device as claimed in claim 10, wherein said high permittivity film has a chemical formula of $ABCO_3$, wherein A is at least one substance selected from a group consisting of Ba, Sr, Pb, Ca, La, Li, and K, B is at least one substance selected from a group consisting of Zr, Ti, Nb, Mg, Mn, Fe, Zn, and W.

14. The device as claimed in claim 10, wherein said high permittivity film has a chemical formula of $(Bi_2O_2)(A_{m-1}B_m O_{3m+1})$ (m=1, 2, 3, 4, and 5) wherein A is at least one substance selected from a group consisting of Ba, Sr, Pb, Ca, K and B is at least one substance selected from a group consisting of Nb, Ta, Ti, and W.

15. The device as claimed in claim 10, wherein said third and fourth conductive films are a film which maintains the conductance even in the oxidizing atmosphere during deposition of said high permittivity film.

16. The device as claimed in claim 15, wherein said film which maintains the conductance is formed by a material selected from the group consisting of Ru, Pd, Re, Os, Ir, and Rh, oxide thereof, silicide compound thereof.

17. The device as claimed in claim 16, wherein said film which maintains the conductance is formed by a material selected from the group consisting of $RuO_2$ and RuO.

18. The device as claimed in claim 9, wherein said first and third conductive films have the same width as said second and fourth conductive films respectively.

19. The device as claimed in claim 9, wherein said second portion of said substrate is located at a scribing area.

* * * * *